(12) United States Patent
Hattori et al.

(10) Patent No.: US 6,411,137 B2
(45) Date of Patent: Jun. 25, 2002

(54) LOAD DRIVE APPARATUS HAVING PARALLEL-CONNECTED SWITCHING DEVICES

(75) Inventors: Hiroshi Hattori, Handa; Hideki Kabune, Chiryu, both of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/833,681

(22) Filed: Apr. 13, 2001

(30) Foreign Application Priority Data

Apr. 28, 2000 (JP) ........................................ 2000-130807

(51) Int. Cl.[7] ................................................ H03K 3/00
(52) U.S. Cl. ........................................ 327/108; 327/550
(58) Field of Search ........................ 327/108–112, 383, 327/403, 405, 427, 434, 437, 544–546, 550

(56) References Cited

U.S. PATENT DOCUMENTS

| | | | |
|---|---|---|---|
| 5,329,192 A | * | 7/1994 | Wu et al. .................... 327/387 |
| 5,889,663 A | * | 3/1999 | Tabata et al. ............. 363/56.03 |
| 6,111,736 A | * | 8/2000 | Blain ........................... 361/88 |
| 6,137,705 A | * | 10/2000 | Maekawa et al. ........... 363/132 |
| 6,278,306 B1 | * | 8/2001 | Ang et al. ..................... 326/82 |

* cited by examiner

*Primary Examiner*—My-Trang Nu Ton
(74) *Attorney, Agent, or Firm*—Law Offices of David G. Posz

(57) ABSTRACT

A load drive apparatus for an electric load has a plurality of switching circuits having respective power MOS transistors and connected in parallel with each other to drive an electric load. The switching circuits have INH input/output terminals for driving ON/OFF of the power MOS transistors. When a high voltage detecting unit detects that a power-source voltage is high, the high voltage detecting unit outputs a high level to turn off the power MOS transistors. The MOS transistor of one switching circuits turns on and the voltage of the INH input/output terminal of the same switching circuit becomes low. Thereby, the INH input/output terminal of another switching circuits becomes low to turn off simultaneously the power MOS transistor of another switching circuit.

8 Claims, 9 Drawing Sheets

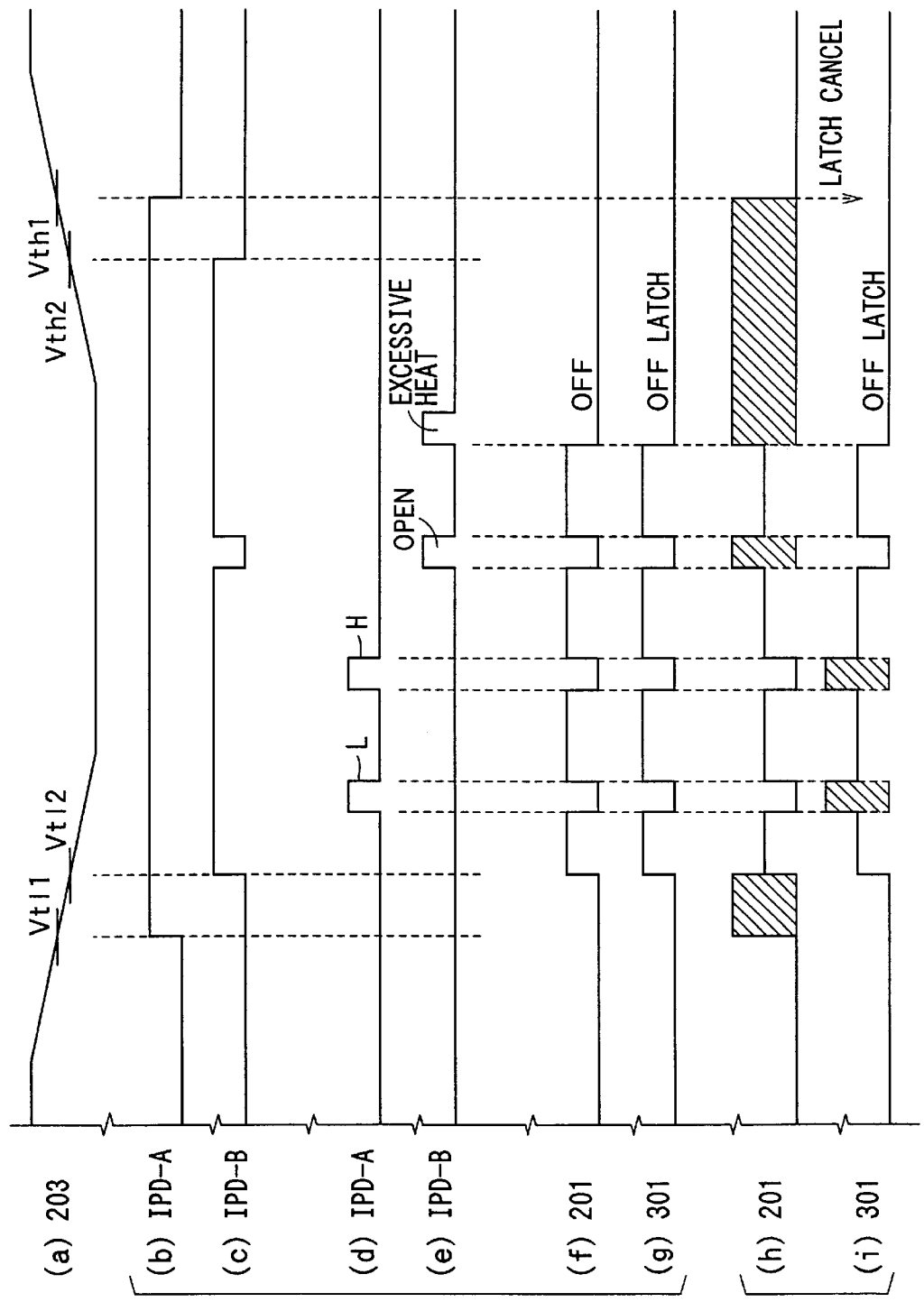

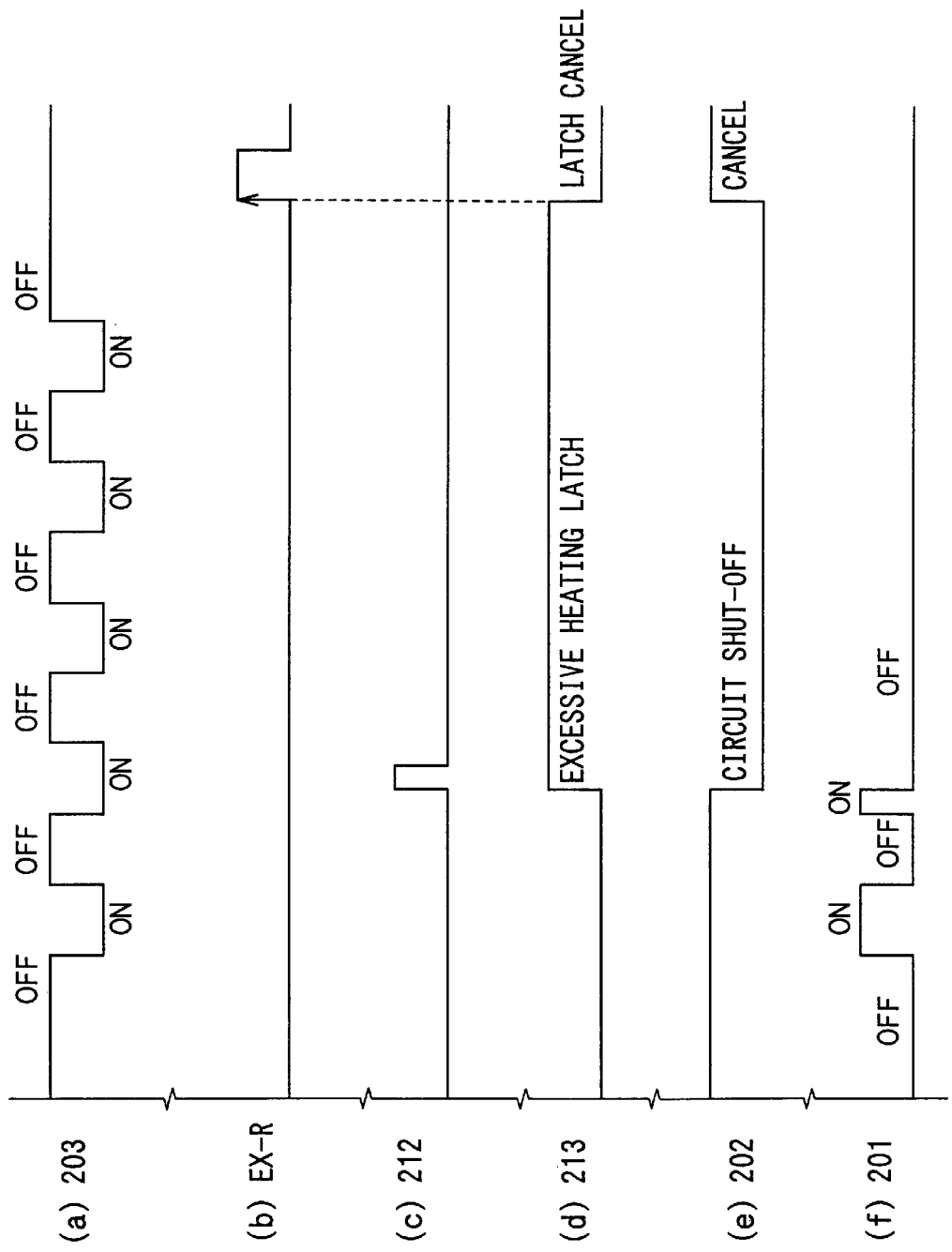

LOAD DRIVE APPARATUS HAVING PARALLEL-CONNECTED SWITCHING DEVICES

CROSS REFERENCE TO RELATED APPLICATION

This application is based on and incorporates herein by reference Japanese Patent Application No. 2000-130807 filed Apr. 28, 2000.

BACKGROUND OF THE INVENTION

The present invention relates of a load drive apparatus used to drive a motor, a solenoid or the like.

In a recent automatic control system for vehicles, a load control circuit uses a semiconductor switching device for driving electric loads. However, as the load consumes more electric power, the semiconductor switching device becomes larger in size, resulting in that the manufacturing yield is lowered, package quality is also lowered and manufacturing cost rises.

It is proposed to use a plurality of semiconductor switching devices connected in parallel for driving the load, thereby to reduce the power supplied to each semiconductor switching device. In addition, it is also proposed to protect each semiconductor switching device from excessive heating due to short-circuit of the load, and from over voltage and low voltage failure due to a failure of an alternator or a battery.

However, each semiconductor switching device does not turn off simultaneously, but turns off keeping a certain time difference due to variation of detection level in each device during the parallel drive. Thus, a load current concentrates on the switching device that is delayed to turn off even if each semiconductor switching device is caused to turn off during detection of an abnormality.

SUMMARY OF THE INVENTION

It is an object of the present invention to provide a load drive device which prevents the power from concentrating in any semiconductor switching device.

According to the present invention, a plurality of switching circuits having respective switching devices are respectively provided with INH input terminals and INH output terminals. The INH input terminals are connected to the INH output terminals. When a signal to turn off the switching devices is outputted from any INH output terminal of the switching circuits, this signal is inputted to the INH input terminals of the other switching circuits. Thus, all the switching circuits turn off the respective switching devices simultaneously. Thereby, at the time of parallel drive of the semiconductor switching devices for driving an electric load, it can be prevented that the power concentrates on any semiconductor switching device due to variation in switching operations.

BRIEF DESCRIPTION OF THE DRAWINGS

The above and other objects, features and advantages of the present invention will become more apparent from the following detailed description made with reference to the accompanying drawings. In the drawings:

FIG. 8 is a timing diagram of signals developed in the semiconductor relays used in the first embodiment and the comparative example;

FIG. 10 is a timing diagram of signals developed when an external reset signal is inputted to a delay terminal in a third embodiment of the present invention.

DETAILED DESCRIPTION OF THE EMBODIMENT

The present invention will be described in further detail with reference to various embodiments which are directed to an electronic control unit (ECU) for an anti-lock brake system (ABS) control for vehicles.

First Embodiment

Figure 1:
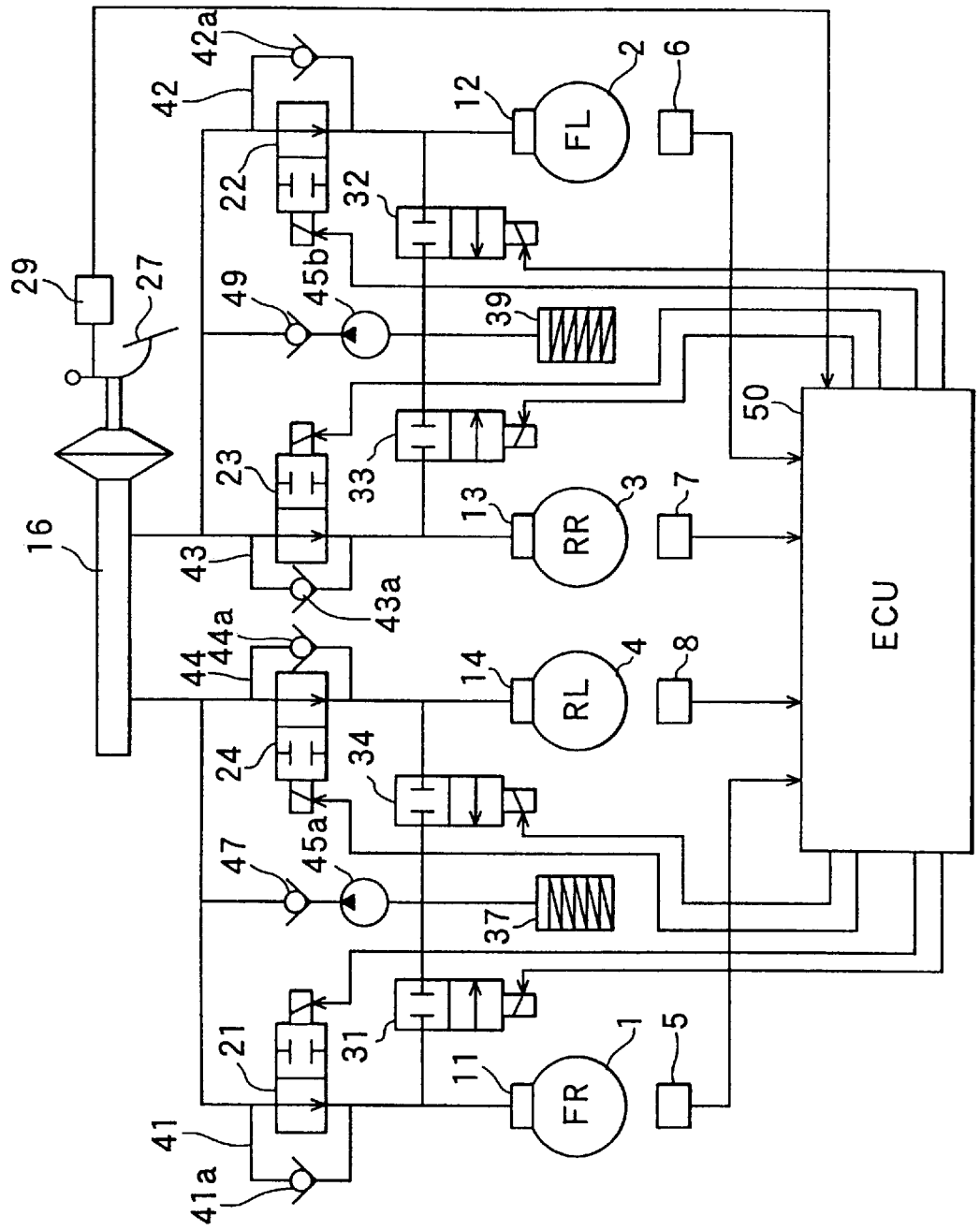
FIG. 1 is a schematic diagram of an ABS control system having an ABS ECU which uses a load drive device according to a first embodiment of the present invention.

Referring first to FIG. 1, a front-right (FR) wheel 1, a front-left (FL) wheel 2, a rear-right (RR) wheel 4 and a rear-left (RL) wheel 4 are provided with an electromagnetic pickup type, a magneto-resistive effect device (MRE) type or a Hall device type wheel speed sensors 5 to 8, respectively. These wheel speed sensors 5 to 8 generate respective pulse signals depending on rotation of the wheels 1 to 4.

Moreover, the wheels 1 to 4 are respectively provided with wheel cylinders 11 to 14. When a master cylinder 16 generates a brake fluid pressure depending on the driver's stepping-on amount of a brake pedal 27, this brake fluid pressure is transferred to the wheel cylinders 11 to 14 via dual-position valves (pressure increase control valves) 21 to 24 and through respective fluid pressure piping. The stepping-on condition of the brake pedal 27 is detected by a stop (brake) switch 29.

Moreover, the wheel cylinders 11, 14 are connected with a reservoir 37 via dual-position valves (pressure decrease control valves) 31, 34, respectively. The wheel cylinders 12, 13 are connected with a reservoir 39 via dual-position valves (pressure decrease control valves) 32, 33, respectively.

The dual-position valves 21 to 24 and 31 to 34 are each comprised of a solenoid drive type dual-position valve including a communication position and a shut-off position. These communication position and shut-off position can be switched by feeding electric power to the solenoid.

On the other hand, the upstream and downstream of the dual-position valves 21 to 24 are connected with bypass piping 41 to 44, respectively. These bypass piping 41 to 44 are provided with non-return valves 41a to 44a, respectively. Only the fluid pressure toward the master cylinder 16 from the wheel cylinders 11 to 14 flows through the bypass piping 41 to 44.

The reservoirs 37, 39 are connected with a fluid pressure piping via pumps 45a, 45b driven by a motor not shown and non-return valves 47, 49, respectively. Only the fluid pressure toward the master cylinder 16 from the reservoirs 37, 39 is allowed to flow.

Detection signals of the wheel speed sensors 5 to 8 and stop switch 29 are inputted to an ECU 50 for ABS control. The ABS control ECU 50 generates, based on the above detection signals, control signals for the dual-position valves 21 to 24 and 31 to 34 and motor control signals to drive the pumps 45a, 45b. On the basis of these control signals, the dual-position valves 21 to 24 and 31 to 34 and motor are controlled for the purpose of ABS control or the like.

Figure 2:
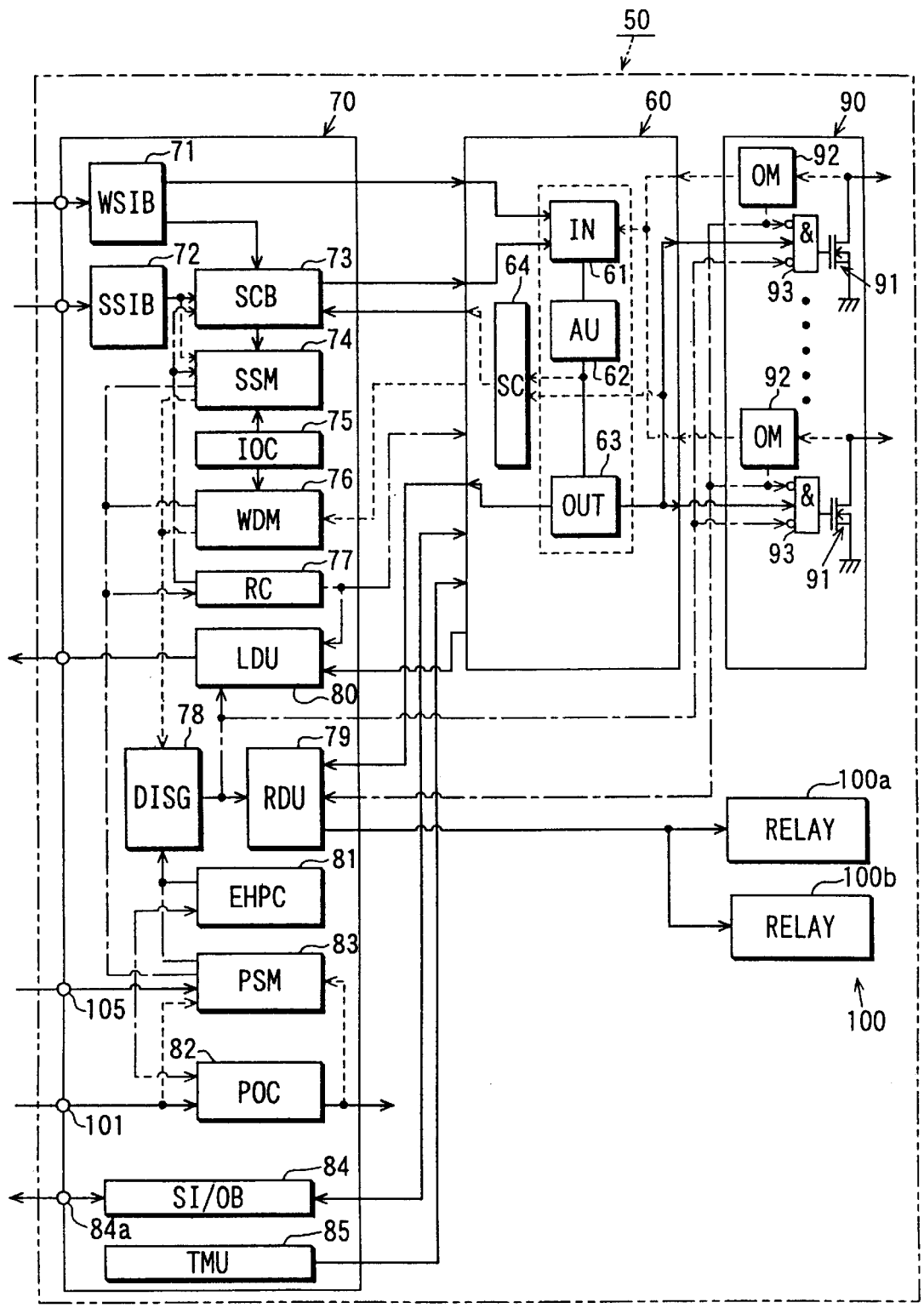
FIG. 2 is a block diagram of the ECU shown in FIG. 1.

As shown in FIG. 2, the ABS control ECU 50 has a plurality of chips including a microcomputer 60, a peripheral IC 70, a solenoid driver 90 and a semiconductor relay 100 or the like. Each arrow mark in a solid line in FIG. 2 indicates a control system line, each arrow mark in a broken line indicates a monitor system line, and each arrow mark in a chain line indicates an inhibit/shut-off system line. The control system line means that a device at the front end of the arrow mark is controlled based on a signal from a device at the rear end of the arrow mark. Moreover, the monitor system line means that a device at the front end of the arrow mark monitors whether a specified device fails or not based on a signal from a device at the rear end of the arrow mark. Moreover, the inhibit/shut-off system line means that a device at the front end of the arrow mark inhibits or shuts off a drive of a specified device based on an inhibit/shut-off signal from a device at the rear end of the arrow mark.

The microcomputer 60 comprises an input unit 61, an arithmetic unit 62, an output unit 63. When various information pieces such as the wheel speed signals are inputted to the input unit 61, the arithmetic unit 62 performs various arithmetic operations used for ABS control based on such various information inputs. The output unit 63 generates ABS control signals, that is, solenoid drive signals and motor drive signals based on the arithmetic operation. Moreover, the microcomputer 60 is also provided with a serial communication unit 64. When various signals produced in the arithmetic operation of the arithmetic unit 62 (for example, ABS control signal indicating the ABS control condition) are inputted, these various signals are converted to a serial signal and then sent to the peripheral IC 70 as the serial signal.

The peripheral IC 70 comprises a wheel speed input buffer 71, a switch (SW) signal input buffer 72, a serial communication buffer 73, a serial communication monitor unit 74, an internal oscillator circuit 75, a watch-dog (WD) monitor unit 76, a reset control unit 77, a drive inhibit signal generating unit 78, a relay drive unit 79, a lamp drive circuit 80, an excessive heating protection circuit 81, a power supply output unit 82, a power supply monitor circuit 83, a signal input/output buffer 84 and a temperature monitor unit 85. Each circuit or unit is integrated into one chip to form the peripheral IC 70.

The wheel speed input buffer 71 performs waveform shaping to correct the detection signals transmitted from the wheel speed sensors 5 to 8 of FIG. 1 into a rectangular shape. The wheel speed signal shaped in the waveform by this wheel speed input buffer 71 is then inputted to the microcomputer 60 for various arithmetic operations of wheel speeds and estimated body speed or the like used for ABS control. Moreover, the wheel speed input buffer 71 also detects a breakage of wire connecting the wheel speed sensors 5 to 8 and the ABS control ECU 50. This buffer 71 transmits a wire breakage signal indicating the breakage of wire to the serial communication buffer 73 when the wire breakage is detected.

The SW signal input buffer 72 monitors ON/OFF signal of the stop switch 29 and a signal indicating that the power is fed or not to the solenoids of the dual-position valves 21 to 24, 31 to 34 (for example, a voltage value applied on the solenoid) indicated in FIG. 1. Thereby, the ON/OFF signal indicating whether the brake pedal 27 is stepped on or not and the ON/OFF signal indicating whether the electric power is supplied to the solenoid or not can be outputted.

The serial communication buffer 73 converts a wire breakage signal from the wheel speed input buffer 71 and the ON/OFF signal from the SW signal input buffer 72 to the serial signal, and then transmits the serial signal to the microcomputer 60.

The above-described serial signal from the microcomputer 60 is transmitted to this serial communication buffer 73.

The serial signal monitor unit 74 monitors the microcomputer 60 based on the serial signal from the serial communication buffer 73. More specifically, the serial communication buffer 73 receives the result of arithmetic operation from the microcomputer 60 based on the signals from the wheel speed input buffer 71 and SW signal input buffer 72 to monitor whether this signal is normal or not. For example, when the signal indicating the ABS control condition is transmitted from the serial control unit 64 in spite that the OFF signal indicating that the stop switch 29 is not stepped on is transmitted from the SW signal input buffer 72, it is determined that the serial signal from the microcomputer 60 is not normal. When the serial signal from the microcomputer 60 is not normal, a reset signal is outputted to the reset control unit 77 or an inhibit signal is transmitted to the drive inhibit signal generating circuit 78.

The internal oscillator unit 75 forms an internal clock used by the serial signal monitor unit 74 and the WD monitor unit 76 or the like. In this internal oscillator unit 75, a plurality of clock signals are generated at different time points (timings) and the serial signal monitor unit 74 and WD monitor unit 76 select the clock signal of appropriate timing as a monitor signal to realize a monitoring function.

The WD monitor unit 76 monitors whether the arithmetic operation in the microcomputer 60 is performed normally or not based on the data such as arithmetic operation period produced from the microcomputer 60. For example, since the WD monitor signal is produced as a signal that is alternately inverted when the arithmetic operation is performed normally, if the WD monitor signal is not inverted alternately, it indicates that the arithmetic operation of the microcomputer 60 is not executed normally. When the arithmetic operation of the microcomputer 60 is not executed in the normal period, a reset signal is outputted to the reset control unit 77 or the inhibit signal is transmitted to the drive inhibit signal generating circuit 78.

At the time of initialization or when the reset signal is inputted to the reset control unit 77 from the serial signal monitor unit 74, WD monitor unit 76 and power supply monitor unit 83, the reset signal is transmitted to the microcomputer 60. Upon reception of this reset signal, the microcomputer 60 sets the values thereof to a mode of a predetermined reset condition. For example, the microcomputer 60 stops all arithmetic operations. Moreover, this reset signal is also transmitted to the serial communication buffer 73 and serial signal monitor unit 74 for the purpose of initialization based on this reset signal.

The drive inhibit signal generating unit 78 transmits a solenoid drive inhibit signal and a motor drive inhibit signal to the relay drive unit 79 based on the inhibit signals from the serial signal monitor unit 74, the WD monitor unit 76, the excessive heating protection circuit 81 and power supply monitor unit 83 and also transmits directly the drive inhibit signal to a solenoid drive driver 90 without via the microcomputer 60. Therefore, when the solenoid drive inhibit signal is transmitted from the drive inhibit signal generating unit 78, the drive of solenoids is inhibited even when the microcomputer 60 is in operation.

The relay drive unit 79 controls switching of a semiconductor relay unit 100 and also controls power supply to the motor to drive the solenoids and pumps 45a, 45b based on the solenoid drive signals and motor drive signal from the microcomputer 60. Moreover, when the solenoid drive inhibit signal and motor drive inhibit signal are inputted from the drive inhibit signal generating unit 78 and the output monitor unit 92 of the solenoid driver 90, the relay drive unit 79 stops power supply to the solenoids and to the motor with the semiconductor relay unit 100.

The lamp drive unit 80 outputs under the normal condition the operating condition of the ABS control based on an ABS control condition signal from the microcomputer 60. However, it outputs a non-operating condition of the ABS control when the reset signal from the reset control unit 77 is inputted or when the solenoid drive inhibit signal and the motor drive inhibit signal are inputted from the drive inhibit signal generating unit 78. The lamp not shown lights up by receiving the signal from the lamp drive unit 80 to ensure the operating condition of the ABS control.

The excessive heating protection circuit 81 detects that the chip has reached a predetermined temperature in order to prevent that the chip providing the peripheral circuit 70 reaches an abnormal temperature. When the chip has reached the predetermined temperature, the excessive heating protection circuit 81 causes the drive inhibit signal generating unit 78 to generate the inhibit signal and stops supply of voltage to the microcomputer 60 in view of preventing further temperature rise.

The power supply output circuit 82 corresponds to a monitored block and is connected to a power supply terminal (first power supply terminal) 101, which is connected to an external power supply allocated at the outside of the ECU 50, and a ground terminal (first ground terminal). The power supply output circuit 82 outputs a predetermined voltage (for example, 5V, 3.3V) based on the voltage applied to the power supply terminal 101. An output voltage of the power supply output circuit 82 is used as a power supply voltage of the microcomputer 60, the peripheral IC 70 and the solenoid driver 90 or the like.

The power supply monitor unit 83 corresponds to a monitor block and is connected to a power supply terminal (second power supply terminal) 105 other than the power supply terminal 101 connected with the power supply output circuit 82 and a ground terminal (second power supply terminal). The power supply monitor unit 83 monitors whether the output voltage of the power supply output circuit 82 is the predetermined value or not and also monitors whether the voltage applied to the power supply output circuit 82 is an excessive voltage or not. For example, when the output voltage of the power supply output circuit 82 is less than the predetermined voltage, a reset signal is transmitted to the reset control unit 77. When it is higher than the predetermined value, an inhibit signal is transmitted to the drive inhibit signal generating unit 78. Moreover, the voltage applied to the power supply output circuit 82 is excessive voltage, the inhibit signal is outputted to the drive inhibit signal generating unit 78 and feeding of voltage to the microcomputer 60 is stopped to prevent excessive heating.

The signal input/output buffer 84 is connected to a terminal 84a for checking for diagnosis when a car has a failure, and a tester is connected to a terminal 84a to make communication with the microcomputer 60. Moreover, the signal input/output buffer 84 may be used as only an output buffer, for example, as a buffer which outputs the signal for indicating a vehicle speed displayed on a vehicle speed meter (for example, a signal corresponding to the estimated vehicle speed calculated from the wheel speed).

The temperature monitor unit 85 always detects temperature of the ECU 50. The temperature monitor unit 85 outputs the signal depending on the temperature of ECU 50 to the microcomputer 60 as a temperature detection signal. Based on this temperature detection signal, the microcomputer 60 performs the arithmetic operation for the ABS control depending on the detected temperature.

The solenoid driver 90 comprises MOS transistors 91 connected to the solenoids, output monitor units 92 for monitoring voltage supply condition to the solenoids (MOS transistors 91) and AND circuits 93 for ON/OFF drive of the MOS transistors 91. The MOS transistors 91 are connected to the respective solenoids of the various control valves 21 to 24, 31 to 34 shown in FIG. 1 to execute switching for voltage supply.

The output monitor units 92 are provided on one-to-one basis to the solenoids to monitor a driver output to each solenoid. For example, it monitors the voltage feeding condition to the solenoid based on the drain voltage and drain current of the MOS transistor 91. Thereby, for example, it is detected whether a drain current is excessive or not and whether a power ID supply wire to the solenoid is open or not or the current is leaking or not, and moreover whether the MOS transistor 91 is in the excessively high temperature or not. Thereby, if the result not suitable for driving the solenoid is attained, the output monitor unit 92 transmits the solenoid drive inhibit signal and the motor drive inhibit signal to the relay drive unit 79 and also outputs the solenoid drive inhibit signal to the AND circuit 93.

To the AND circuit 93, an output signal of the microcomputer 60, an output signal from the relay drive unit 79, an output signal from the drive inhibit signal generating unit 78 and an output signal from the output monitor unit 92 are inputted. In the case of this embodiment, the output signals from the relay drive unit 79, the drive inhibit signal generating unit 78 and the output monitor unit 92 are normally at low level. However, if any failure occurs, it turns to high level and the output of the AND circuit 93 becomes low, that is, the MOS transistor 91 turns off.

Thus, the solenoid driver 90 not only shuts off the power supply to the solenoid based on the signal from the microcomputer 60 and peripheral IC 70 but also shuts off the power supply to the solenoid based on the signal from the output monitor unit 92 provided within the solenoid driver 90 itself.

In the semiconductor relay unit 100, the power supply to the solenoids is switched by a semiconductor relay 100a, while the power supply to the motor to drive the pumps 45a, 45b is switched by a semiconductor relay 10b. These semiconductor relays 100a, 100b are constructed to be controlled on the basis of the signal from the relay drive unit 79 to normally enable power supply to the solenoids and the motors and to disable the power supply to the solenoids and the motors upon reception of the solenoid drive inhibit signal and the motor drive inhibit signal from the relay drive unit 79.

Figure 3C:
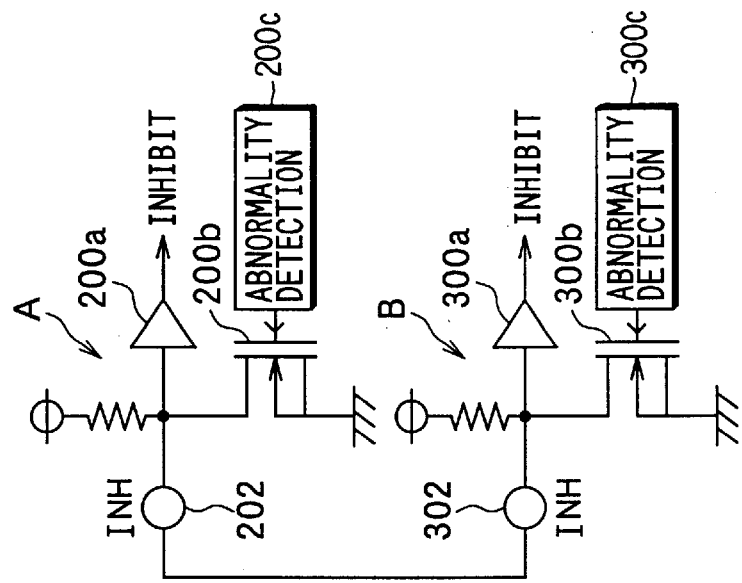
FIGS. 3A to 3C are schematic circuit diagrams of a semiconductor relay used in the ECU shown in FIG. 2.
Figure 3B:
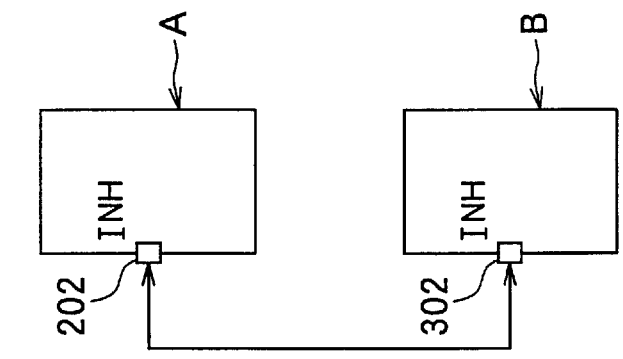
Figure 3A:
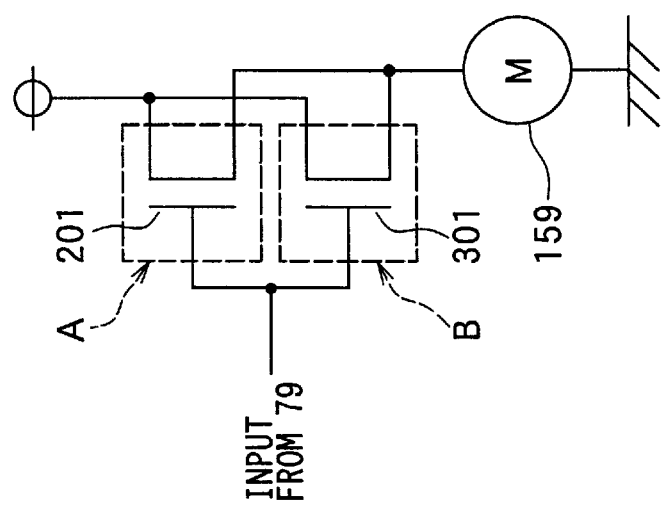

The semiconductor relay 100a to drive the solenoid and the semiconductor relay 100b to drive the motor forming the semiconductor relay unit 100 are formed in the identical structure. FIGS. 3A to 3C are circuit diagrams of the semiconductor relay 10b.

As shown in FIG. 3A, the semiconductor relay 100b has a structure that a plurality of intelligent power devices A, B (the IPD-A and the IPD-B) provided with power MOS transistors 201 and 301 are connected in parallel. These IPD-A and the IPD-B have the similar circuit structure to be driven in parallel with an input signal outputted from the relay drive unit 79 (FIG. 2).

Moreover, each the IPD-A and the IPD-B is respectively provided with an abnormality detecting unit to detect various abnormalities. When an abnormality is detected by these abnormality detecting units, each the IPD-A and the IPD-B turns off the power MOS transistors 201 and 301 provided therein.

Specifically, as shown in FIG. 3B, each the IPD-A and the IPD-B is connected with INH(Inhibit) input/output terminals 202 and 302. When any one of the IPD-A and the IPD-B detects an abnormality, not only power MOS transistors 201 and 301 provided in the IPD-A and the IPD-B of which abnormality is detected but also the power MOS transistors 201 and 301 provided in the other the IPD-A and the IPD-B are also turned off via the INH input/output terminals 202 and 302.

For example, the IPD-A and the IPD-B have the circuit structures shown in FIG. 3C. In this structure, in the normal drive condition where an abnormality is not detected by abnormality detection circuits 200c, 300c, the INH input/output terminals 202 and 302 are connected with each other. Therefore, outputs of driver circuits 200a, 300a provided in the IPD-A and the IPD-B change synchronously. Therefore, the power MOS transistors 201 and 301 provided in the IPD-A and the IPD-B are turned on and off simultaneously.

Moreover, if an abnormality is detected in any one of the IPD-A and the IPD-B, for example, in the IPD-A, the MOS transistor 200b is turned on to output a low level as an inhibit signal from the driver circuit 200a and to output a low level as an inhibit signal also from the driver circuit 300a of the IPD-B. Therefore, the power MOS transistors 201 and 301 are turned off simultaneously by receiving a low level output as the inhibit signal.

Figure 4:
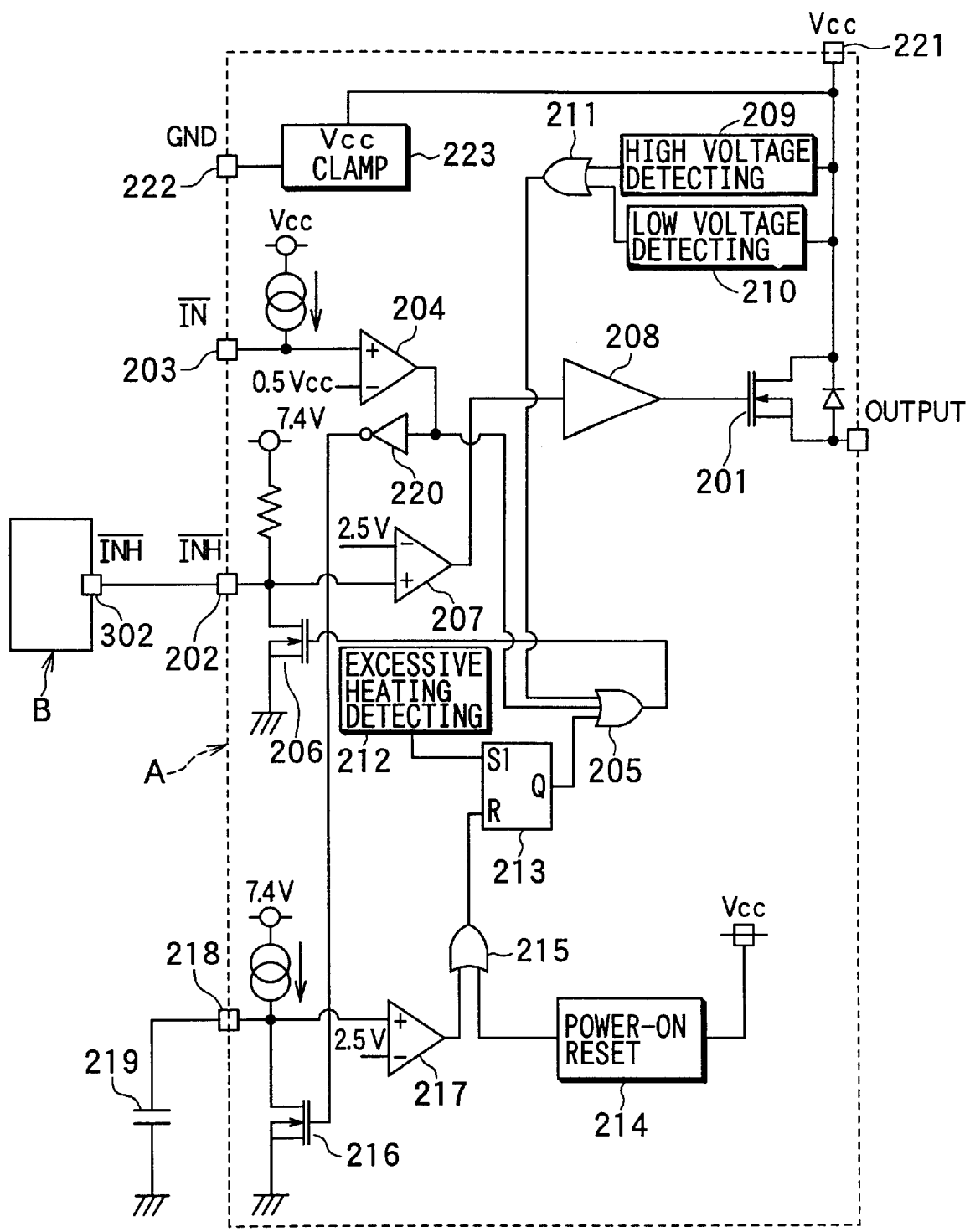
FIG. 4 is a detailed circuit diagram of the semiconductor relay shown in FIGS. 3A to 3C.

FIG. 4 shows a detailed circuit structure of the IPD-A. Since the IPD-B has also a similar circuit structure, only the IPD-A is described.

A voltage based on a duty control signal of the relay drive unit 79 is applied to the input terminal (IN terminal) 203 of the IPD-A. Specifically, although a low level voltage is applied to the relay drive unit 79 when the motor is driven, a high level voltage is applied from the relay drive unit 79 when the motor is not driven and the motor drive inhibit signal is transmitted.

The voltage applied to the input terminal 203 is compared with a predetermined threshold value voltage (for example, 0.5 Vcc) in a comparator 204, and the comparison result is outputted to a MOS transistor 206 via an OR circuit 205. Therefore, when the high level voltage is applied to the input terminal 203 when the motor is not driven and the motor drive inhibit signal is transmitted, the high level is outputted from the OR circuit 205 to turn on the MOS transistor 206. Thereby, the voltage of the INH input/output terminal 202 becomes the low level. This low level output from this INH input/output terminal 202 corresponds to the inhibit signal to inhibit the power MOS transistors 201 and 301 to turn on.

When the voltage of the INH input/output terminal 202 becomes low as explained above, an output of a comparator 207 becomes low, an output from a driver circuit 208 becomes low and thereby the power MOS transistor 201 is turned off.

Meanwhile, when the voltage of the INH input/output terminal 202 of the IPD-A becomes low, since the INH input/output terminal 202 of the IPD-A and the INH input/output terminal 302 of the IPD-B are connected, the voltage of the INH input/output terminal 302 of the IPD-B becomes low. Therefore, the IPD-B having the similar circuit structure as the IPD-A also turns off the power MOS transistor 301 provided in the IPD-B.

Thus, when the high level voltage is applied from the relay drive unit 79, the power MOS transistors 201 and 301 provided in the IPD-A and the IPD-B can be simultaneously turned off.

Moreover, the IPD-A is provided with a high voltage detecting unit 209 and a low voltage detecting unit 210. The high voltage detecting unit 209 compares the voltage Vcc to drive the motor and a predetermined voltage value which is higher than the voltage Vcc in the normal condition in order to detect that the voltage Vcc is higher than the predetermined voltage value. The high voltage detecting unit 209 outputs a high level when the voltage Vcc is higher than the predetermined voltage value. Moreover, the low voltage detecting unit 210 compares the voltage Vcc to drive the motor with a predetermined voltage value which is lower than the voltage Vcc under the normal condition to detect that the voltage Vcc is lower than the predetermined voltage value. The low voltage detecting unit 210 outputs a high level when the voltage Vcc is lower than the predetermined voltage value.

When these high voltage detecting unit 209 and low voltage detecting unit 210 output the high level, the OR circuit 205 outputs a high level via an OR circuit 211 to turn on the MOS transistor 206. Thereby, the voltage of INH input/output terminal 202 becomes low.

When the voltage of the INH input/output terminal 202 becomes low as above, the output of the comparator 207 becomes low and an output of the driver circuit 208 becomes low to turn off the power MOS transistor 201.

Moreover, when the voltage of INH input/output terminal 202 of the IPD-A becomes low, the voltage of the INH input/output terminal 302 of the IPD-B becomes low as above. Therefore, the IPD-B having the circuit structure similar to that of the IPD-A turns off the power MOS transistor 301 provided in the IPD-B.

When it is detected that the motor drive voltage is higher or lower than the respective predetermined voltage values by the high voltage detecting unit 209 and low voltage detecting unit 210 provided in the IPD-A, the power MOS transistors 201 and 301 provided in the IPD-A and the IPD-B are simultaneously turned off.

Though not shown in FIG. 4, like the IPD-A and the IPD-B is also provided with its high voltage detecting unit 209 and low voltage detecting unit. Even if it is detected by the high voltage detecting unit 209 and the low voltage detecting unit 210 provided in the IPD-B that the motor drive voltage is higher or lower than a predetermined voltage value, the INH input/output terminal 302 of the IPD-B becomes low and thereby the power MOS transistors 201 and 301 provided in the IPD-A and the IPD-B can be simultaneously turned off.

Moreover, the IPD-A is provided with an excessive heating detecting unit 212. This excessive heating detecting unit 212 is provided to detect that a chip is in the excessive heating condition exceeding a predetermined temperature in order to prevent that temperature of the chip on which the IPD-A is formed becomes abnormally high. This excessive heating detecting unit 212 outputs a high level signal when it is detected that the chip is in the high temperature condition.

When the high level signal is inputted to a RS flip-flop 213 from the excessive heating detecting unit 212, an output of the RS flip-flop 213 is set to the high level and the OR circuit 205 outputs the high level signal.

Therefore, like the case where the high voltage is detected as above, the voltage of INH input/output terminal 202 becomes low and thereby the power MOS transistors 201 and 301 provided in the IPD-A and the IPD-B can be turned off simultaneously.

On the other hand, when the motor is driven or various abnormality conditions are cancelled, the output of the OR circuit 205 becomes low. Accordingly, the power MOS transistors 201 and 301 provided in the IPD-A and the IPD-B are turned on.

In this case, since the INH input/output terminals 202 and 302 of the IPD-A and the IPD-B are connected with each other, the INH input/output terminals 202 and 302 of the IPD-A and the IPD-B become high level only when not only the MOS transistor 206 provided in the IPD-A but also the MOS transistor of the structure similar to the MOS transistor provided in the IPD-A among the IPD-B are turned off. Therefore, the power MOS transistors 201 and 301 provided in each IPD can be turned on simultaneously.

The power MOS transistors 202 and 302 provided in the IPD-A and the IPD-B can be turned on or off simultaneously by connecting the INH input/output terminals 202 and 302 of the IPD-A and the IPD-B. Therefore, it can be prevented that the power is concentrated in the particular power MOS transistors 201 and 301 because the ON/OFF timing of the IPD-A and the IPD-B deviates due to variation in manufacture or the like.

The power-source terminal 221 to which power-source voltage is applied and the ground terminal 222 defined as GND are connected via a Vcc clamp circuit 223. The IPD-A can be protected when ESD surge is generated or during the load damping. In this embodiment, the RS flip-flop 213 is reset based on an initial condition setting signal from a power-on reset unit 214 and the signal from the input terminal 203.

That is, when an OR circuit 215 outputs a high level with the initial condition setting signal (high level signal) supplied from the power-on reset unit 214 and when the MOS transistor 216 is turned off with the high level signal from the relay drive unit 79, a drain voltage of the MOS transistor 216 is higher than the predetermined voltage (2.5V) and a comparator 217 outputs a high level signal, the RS flip-flop 213 is reset.

Here, a capacitor 219 is connected in parallel with the MOS transistor 216 that is turned on and off based on the duty drive signal from the relay drive unit 79 by connecting the capacitor 219 to the delay terminal 218 provided in the IPD-A. The reason of this connection will then be explained below.

Figure 5:
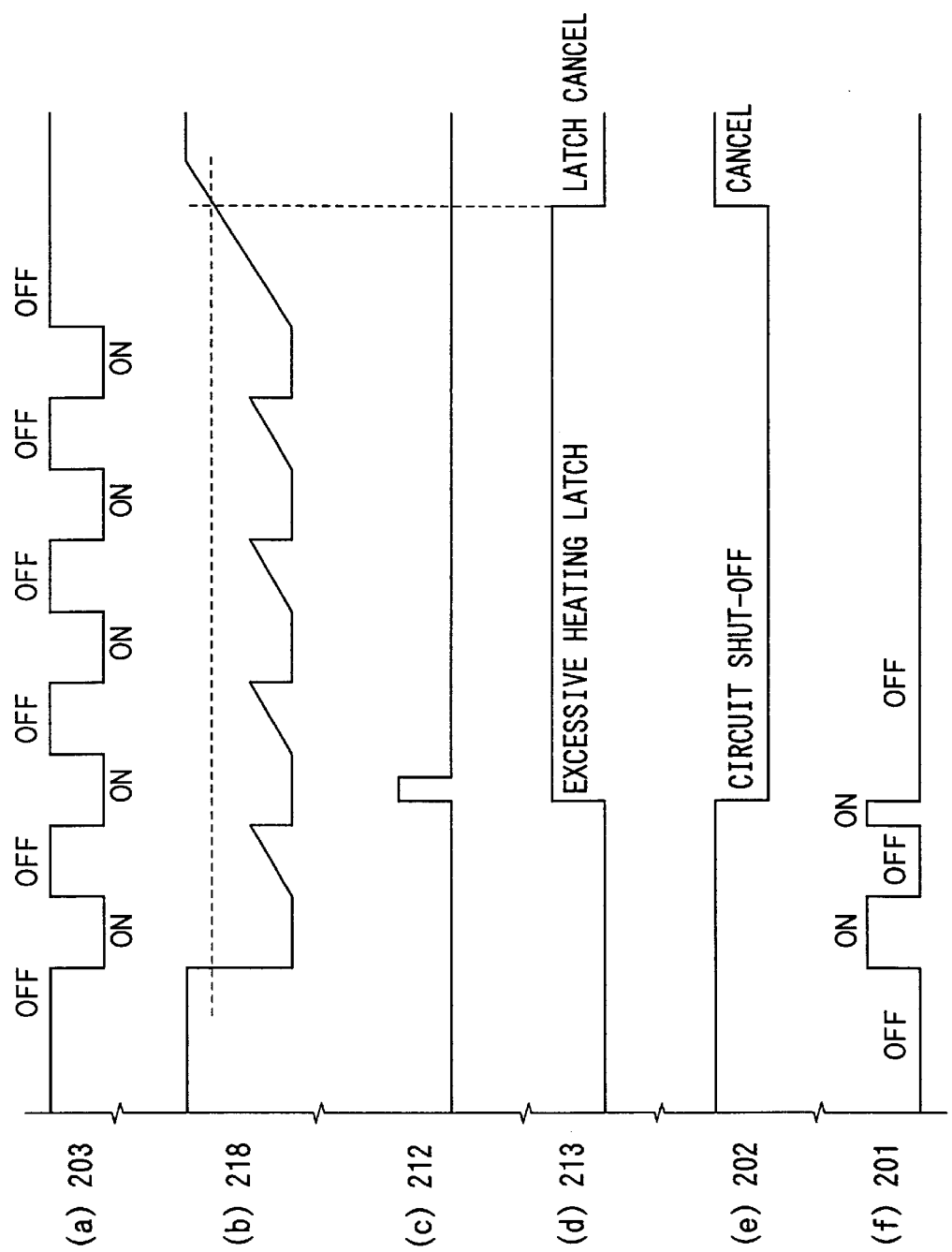
FIG. 5 is a timing diagram of signals developed in the semiconductor relay shown in FIG. 4.

When the RS flip-flop 213 is reset based on the high level signal from the relay drive unit 79, a circuit structure shown in FIG. 5 is assumed as a comparative example. That is, it is thought that the duty drive signal from the relay drive unit 79 is used as the reset signal.

Figure 6:
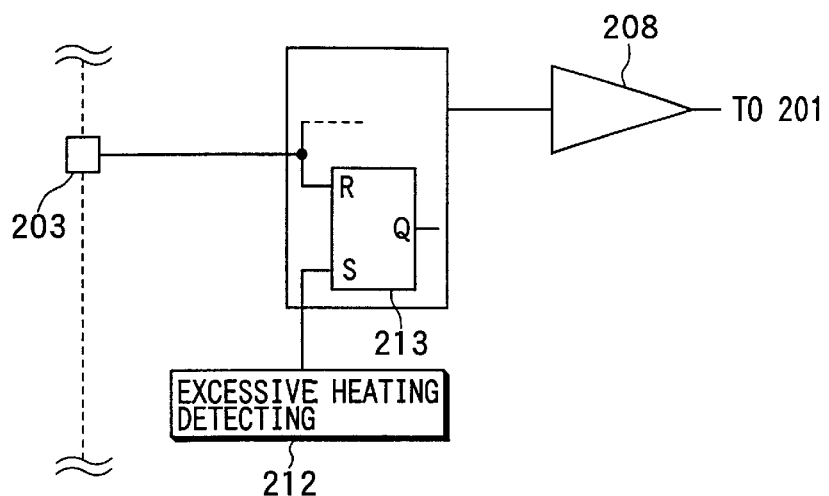
FIG. 6 is a schematic circuit diagram of a comparative example of a semiconductor relay.

However, when the structure shown in FIG. 6 is implemented, there arises that even if it is requested that the power MOS transistor 201 is latched to the OFF condition by latching the output of the RS flip-flop 213 to the high level when the excessive heating condition is detected, the RS flip-flop 213 is reset with the duty drive signal that is turned on and off within a short period of time. Thereby it is impossible to latch the power MOS transistor 201 to the OFF condition.

In view of eliminating such a problem, a delay circuit is formed by connecting in parallel the capacitor 219 to the MOS transistor 216. Thereby, rise of voltage of the delay terminal 218 can be delayed based on the charging constant of the capacitor 219. Therefore,when the excessive heating condition is detected, the RS flip-flop 213 can be protected from the reset condition by the duty drive signal.

FIG. 5 shows a timing diagram of signals developed at respective terminals and circuits of the duty drive signal from the relay drive unit 79. In FIG. 6, (a) is the duty drive signal at the terminal IN 203; (b) is a potential of the delay terminal 218 connected to the capacitor 219; (c) is the output signal of the excessive heating detecting unit 212; (d) is an output signal of the RS flip-flop 213; (e) is a potential (inhibit signal) of the INH input/output terminal; (f) is an output of the IPD-A and the IPD-B (that is, ON/OFF condition of the power MOS transistors 201 and 301).

As shown in the figure, even if the duty drive signal is switched to ON/OFF condition within a short period of time, the MOS transistor 216 is turned on before the capacitor 219 is charged to the level higher than the threshold level of the comparator 217. Therefore, the RS flip-flop 213 is not reset by the duty drive signal.

Figure 7:
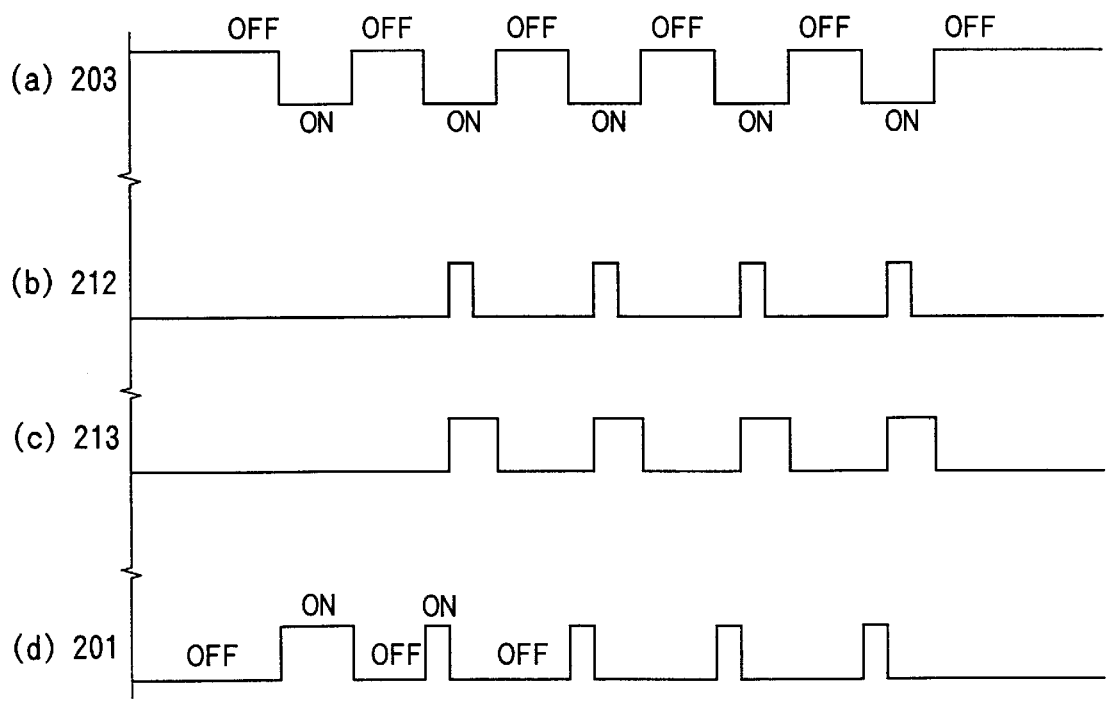
FIG. 7 is a timing diagram of signals developed in the semiconductor relay shown in FIG. 6.

On the other hand, FIG. 7 shows signals developed in the comparative example shown in FIG. 6, (a) is a duty drive signal at the terminal 203; (b) is an output signal of the excessive heating detecting unit 212; (c) is an output signal of the RS flip-flop 213; and (d) is an output of the IPD-A. As shown in this figure, even when the excessive heating condition is detected, the RS flip-flop 213 is reset and the power MOS transistors 201 and 301 are turned on because the duty drive signal is switched to the ON/OFF condition within a short period of time. Thereby, a stress is applied repeatedly to the power MOS transistors 201 and 301.

As described above, when the excessive heating condition is detected, the output of the RS flip-flop 213 is latched, the potential of the INH input/output terminal 202 becomes low and thereby the power MOS transistors 201 and 301 are surely turned off.

The power MOS transistors 202 and 302 provided in each the IPD-A and the IPD-B can be turned on or of f simultaneously by utilizing the semiconductor relay 100*b* of this embodiment. Thereby, it can be prevented that the off-times of the IPD-A and the IPD-B differ due to variation in manufacture or the like and the power concentrates in a particular one of the power MOS transistors 201 and 301.

Moreover, it can be prevented that the power MOS transistors 201 and 301 are erroneously turned on when the excessive heating condition is detected by providing a delay circuit comprising the capacitor 219.

FIG. 8 shows signals developed in the semiconductor relay 100*b* in case of changes in the input signal from the relay drive unit 79. In FIG. 8, (a) is an input signal (input voltage) at terminal 203 from the relay drive unit 79B, (c) are input logic signals at the IPD-A and the IPD-B; (d), (e) are conditions of the IPD-A and the IPD-B; (f), (g) are ON/OFF conditions of the power MOS transistors 201 and 301 in this embodiment; (h), (i) are the ON/OFF conditions of the power MOS transistors 201 and 301 in the comparative example of FIG. 6 under the condition that the INH input/output terminals 202 and 302 of the IPD-A and the IPD-B are not connected and the ON/OFF timings of the power MOS transistors 201 and 301 are not synchronized.

Moreover, Vt11, Vt12 and Vth1, Vth2 shown in the input signal waveform (a) indicate variation of the threshold value to turn on or off the power MOS transistors 201 and 301.

As shown by (b) and (c) in the figures, the input logic signal of the IPD-A turns on when the input signal becomes Vt11 and the input logic of the IPD-B turns on when the input signal becomes Vt12. According to this embodiment shown in FIG. 4, as shown by (f) and (g), the ON/OFF timings of the power MOS transistors 201 and 301 are synchronized. Meanwhile, in the comparative example shown in FIG. 6, as shown by (h) and (i), the ON-timings of the power MOS transistors 201 and 301 are different.

Moreover, as shown in (d), when the low voltage (L) or high voltage (H) is detected in the IPD-A, the power MOS transistor 201 of the IPD-A is turned off in the comparative example. However, the power MOS transistor 301 of the IPD-B is not turned off. On the contrary, in this embodiment, the power MOS transistors 201 and 301 of the IPD-A and the IPD-B are turned off simultaneously.

In addition, as shown in (e), when the input of the IPD-B becomes OPEN or when the excessive heating is detected, the power MOS transistor 301 of the IPD-B is turned off in the comparative example. However, the power MOS transistor 201 of the IPD-A is not turned off. On the contrary, the power MOS transistors 201 and 301 of the IPD-A and the IPD-B are turned off simultaneously in this embodiment.

Accordingly, in the comparative example, the power is concentrated to one of the IPD-A and the IPD-B as shown with the hatched areas due to the variation of the ON/OFF timings of the power MOS transistors 201 and 301 of the IPD-A and the IPD-B. In this embodiment, the power is never concentrated only to one of the IPD-A and the IPD-B.

Since the ON/OFF timings of the power MOS transistors 201 and 301 connected to the IPD-A and the IPD-B can be synchronized, for example, if the reference voltages of the comparator are different in the IPD-A and the IPD-B with the manufacturing variation, it can be prevented that the power is concentrated to the particular the IPD-A and the IPD-B.

Second Embodiment

Figure 9A:
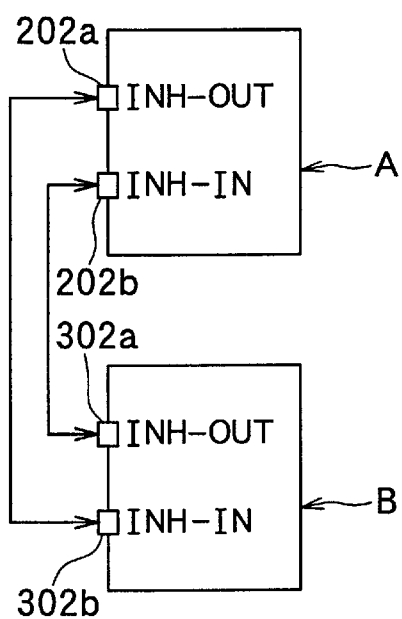
FIGS. 9A and 9B are circuit diagrams of a semiconductor relay used in a second embodiment of the present invention.

In the first embodiment, each of the IPD-A and the IPD-B is connected by providing the INH input/output terminals 202 and 302. However, in a second embodiment shown in FIG. 9A, INH output terminals 202a, 302a and the INH input terminals 202b, 302b are provided separately. The INH output terminal 202a of the IPD-A is connected to the INH input terminal 302b of the IPD-B. The INH output terminal 302a of the IPD-B is connected to the INH input terminal 202b of the IPD-A.

Figure 9B:
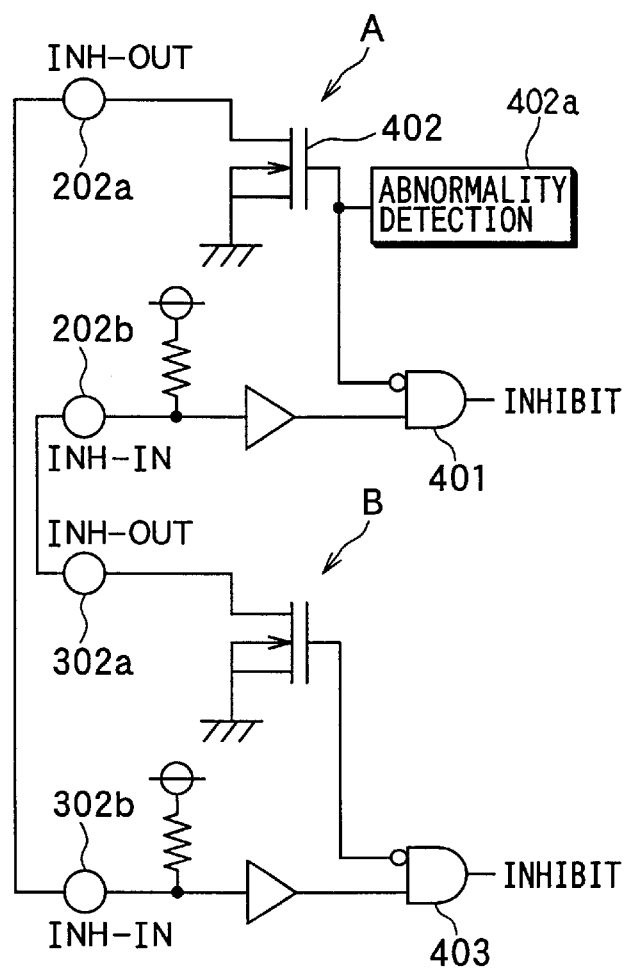

The IPD-A and the IPD-B are constructed in the same manner as shown in FIG. 9B. For example, when an abnormality is detected in the IPD-A, the voltage of an abnormality detecting unit 402a becomes high. An AND circuit 401 generates a low level output as the inhibit signal. Simultaneously, a MOS transistor 402 in the IPD-A turns on and the potential of the INH output terminal 202a becomes low. The INH input terminal 302b of the IPD-B becomes low, and an AND circuit 403 of the IPD-B also outputs the low level as the inhibit signal.

Thus even when the INH output terminals 202a, 302a and the INH output terminals 202b, 302b are provided separately, the advantage similar to that in the first embodiment can also be attained.

Third Embodiment

In the above embodiments, the RS flip-flop 213 is reset with the high level signal from the relay drive unit 79 to be inputted to the input terminal 203. Therefore, the RS flip-flop 213 has not been reset when the excessive heating condition is detected by connecting the capacitor 219 to the delay terminal 218 provided in the IPD-A. However, it is also possible to provide a terminal other than the input terminal 203 to additionally input the signal to control the reset of the RS flip-flop 213 from this terminal.

Signals developed in the IPD-A in such a case are shown in FIG. 10. In FIG. 10, (a) is a duty drive signal from the relay drive unit 79; (b) is a reset signal (EX-R) of the RS flip-flop 213 from an external circuit; (c) is an output signal of the excessive heating detecting unit 212; (d) is an output signal of the RS flip-flop 213; (e) is a potential of the INH input/output terminal (that is, inhibit signal); (f) is an output of the IPD-A and the IPD-B.

As shown in FIG. 10, the RS flip-flop 213 is reset based on the external reset signal even if the duty drive signal is switched on or off within a short period of time, the RS flip-flop 213 is not reset with the duty drive signal. Therefore, the advantage similar to that of the first embodiment can also be attained in this embodiment.

Other Embodiments

It is possible to provide two or more IPDs. When the semiconductor relay is not driven with the duty signal, the semiconductor relay 100a operates to turn off the power MOS transistor when the solenoid drive inhibit signal is outputted from the relay drive unit 79. In this instance, the capacitor 219 or the like is not required. Moreover, the structure of FIG. 2 is not always required, and any one of a plurality of or all of circuits or units may be formed on only one chip.

The present invention is not limited to the disclosed embodiments and modifications, but may be implemented in various other ways.

What is claimed is:

1. A load drive apparatus for an electric load comprising:
    a plurality of switching circuits having respective switching devices and connected in parallel with each other for controlling switching operations of the switching devices and switching currents supplied to a load based on an external input signal,
    wherein the plurality of the switching circuits are respectively provided with INH input terminals and INH output terminals, and an INH input terminal of one switching circuit is connected to an INH output terminal of another switching circuit, and
    wherein, when a signal to turn off the switching devices is outputted from any of the INH output terminals among the plurality of the switching circuits, the signal is inputted to the plurality of the INH input terminals of the switching circuits thereby to turn off the switching devices.

2. A load drive apparatus as in claim 1,
    wherein the switching devices are turned on when a potential of the INH input terminal becomes high, and turned off when the potential of the INH input terminal becomes low, and
    wherein, when the potential of any of the INH output terminals becomes low as a signal to turn off the switching devices, the potential of the INH input terminal becomes low to turn off all the switching devices.

3. A load drive apparatus as in claim 1, further comprising:
a high voltage detecting unit for detecting whether a power-source voltage applied to the switching circuits is higher than a predetermined voltage, and outputting a signal from the INH output terminals to turn off the switching devices when the power-source voltage is higher than the predetermined voltage.

4. A load drive apparatus as in claim 1, further comprising:
a low voltage detecting unit for detecting whether a power-source voltage applied to the switching circuits is lower than a predetermined voltage, and outputting a signal from the INH output terminals to turn off the switching devices when the power-source voltage is lower than the predetermined voltage.

5. A load drive apparatus as in claim 1, further comprising:
an excessive heating detecting unit for detecting an excessive heating condition of a chip on which the switching circuits are provided; and
a latch for outputting a control signal to turn off the switching devices when the excessive heating condition is detected,
wherein the control signal is outputted from the INH output terminal.

6. A load drive apparatus as in claim 5, further comprising:
a delay circuit for delaying a reset timing of the latch from an ON/OFF timing of a duty drive signal, when the external input signal is the duty drive signal and the latch is structured to reset an output of the control signal based on the duty drive signal.

7. A load drive apparatus as in claim 5,
wherein the latch is reset based on a reset signal that is different from the external input signal.

8. A load drive apparatus as in claim 1,
wherein the INH input terminals and INH output terminals of the switching circuits are formed of INH input/output terminals.

* * * * *